(12) United States Patent
Bodenweber et al.

(10) Patent No.: US 9,721,870 B2
(45) Date of Patent: Aug. 1, 2017

(54) COOLING STRUCTURE FOR ELECTRONIC BOARDS

(71) Applicant: INTERNATIONAL BUSINESS MACHINES CORPORATION, Armonk, NY (US)

(72) Inventors: Paul F. Bodenweber, Kingston, NY (US); Kenneth C. Marston, Poughquag, NY (US); Kamal K. Sikka, Poughkeepsie, NY (US); Hilton T. Toy, Hopewell Junction, NY (US); Randall J. Werner, Pougkeepsie, NY (US); Jeffrey A. Zitz, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 254 days.

(21) Appl. No.: 14/561,663

(22) Filed: Dec. 5, 2014

(65) Prior Publication Data

US 2016/0165755 A1    Jun. 9, 2016

(51) Int. Cl.
*H01L 23/46* (2006.01)
*H01L 23/34* (2006.01)
(Continued)

(52) U.S. Cl.
CPC .............. *H01L 23/46* (2013.01); *H01L 23/34* (2013.01); *H01L 23/3672* (2013.01);
(Continued)

(58) Field of Classification Search
CPC ..... H01L 23/473; H01L 23/467; H01L 23/34; H01L 23/3672; H01L 35/30;
(Continued)

(56) References Cited

U.S. PATENT DOCUMENTS 3,365,620 A    1/1968    Butler et al.
5,023,695 A *  6/1991    Umezawa ........... H01L 23/4735
                                                                   257/714
(Continued)

FOREIGN PATENT DOCUMENTS

JP           5533777 B2    6/2014

OTHER PUBLICATIONS

Chrysler et al., "Conduction Augmented Immersion Cooling Scheme", IBM TDB, IPCOM000105240D, Mar. 19, 2005, vol. 36, N7 07-93, pp. 25-26.
(Continued)

*Primary Examiner* — Adam B Dravininkas
(74) *Attorney, Agent, or Firm* — Steven Meyers; Andrew M. Calderon; Roberts Mlotkowski Safran Cole & Calderon, P.C.

(57) ABSTRACT

A cooling structure for large electronic boards with closely-spaced heterogeneous die and packages is disclosed. The assembly includes a frame having a plurality of openings. The assembly further includes a cold plate mounted to the frame. The cold plate includes at least one inlet and at least one outlet and fluid channels in communication with the at least one inlet and the at least one outlet. The assembly further includes a heat sink mounted within each of the plurality of openings which in combination with sidewalls of the openings of the frame and the cold plate form individual compartments each of which are in fluid communication with the fluid channels.

16 Claims, 4 Drawing Sheets

(51) Int. Cl.
  *H01L 35/30* (2006.01)
  *H01L 23/367* (2006.01)
  *G06F 1/20* (2006.01)
  *H01L 23/467* (2006.01)
  *H01L 23/473* (2006.01)

(52) U.S. Cl.
  CPC .............. *H01L 35/30* (2013.01); *G06F 1/203* (2013.01); *H01L 23/467* (2013.01); *H01L 23/473* (2013.01)

(58) Field of Classification Search
  CPC ....... H01L 2225/06589; H01L 23/3677; H01L 23/46; G06F 2200/201; G06F 1/203
  See application file for complete search history.

(56) References Cited

U.S. PATENT DOCUMENTS

| | | | |
|---|---|---|---|
| 5,420,753 A * | 5/1995 | Akamatsu | H01L 23/433 165/80.4 |
| 6,778,393 B2 | 8/2004 | Messina et al. | |
| 7,187,549 B2 | 3/2007 | Teneketges et al. | |
| 7,450,381 B2 | 11/2008 | Gilliland et al. | |
| 7,641,101 B2 | 1/2010 | Campbell et al. | |
| 7,961,465 B2 | 6/2011 | Goldrian et al. | |
| 8,599,557 B2 | 12/2013 | Peterson et al. | |
| 2002/0101718 A1 * | 8/2002 | Negishi | F28F 3/025 361/699 |
| 2002/0185260 A1 * | 12/2002 | Calaman | F28F 3/022 165/80.4 |
| 2005/0141195 A1 * | 6/2005 | Pokharna | F28F 3/025 361/699 |
| 2005/0274487 A1 * | 12/2005 | Goth | F28D 15/02 165/80.2 |
| 2006/0002086 A1 * | 1/2006 | Teneketges | H01L 23/473 361/699 |
| 2006/0120043 A1 | 6/2006 | Wolford et al. | |
| 2008/0197483 A1 | 8/2008 | Ouyang | |
| 2009/0213541 A1 | 8/2009 | Butterbaugh et al. | |
| 2009/0284921 A1 * | 11/2009 | Colgan | H01L 23/473 361/699 |
| 2013/0128461 A1 * | 5/2013 | Nagasawa | G06F 1/20 361/704 |
| 2013/0147503 A1 | 6/2013 | Kamath et al. | |
| 2013/0327369 A1 * | 12/2013 | Jovoic | H01L 35/32 136/205 |
| 2014/0158326 A1 | 6/2014 | Lyon | |

OTHER PUBLICATIONS

Moran et al., "Spring Loaded Module Connectors for Mounting an Array of Modules on Circuit Board", IBM TDB 02-78, IPCOM000068687D, Feb. 20, 2005, pp. 3434-3435.

Unknown, "Method for Localized Immersion Cooling", IPCOM000008376D, Jun. 11, 2002, 4 pages.

\* cited by examiner

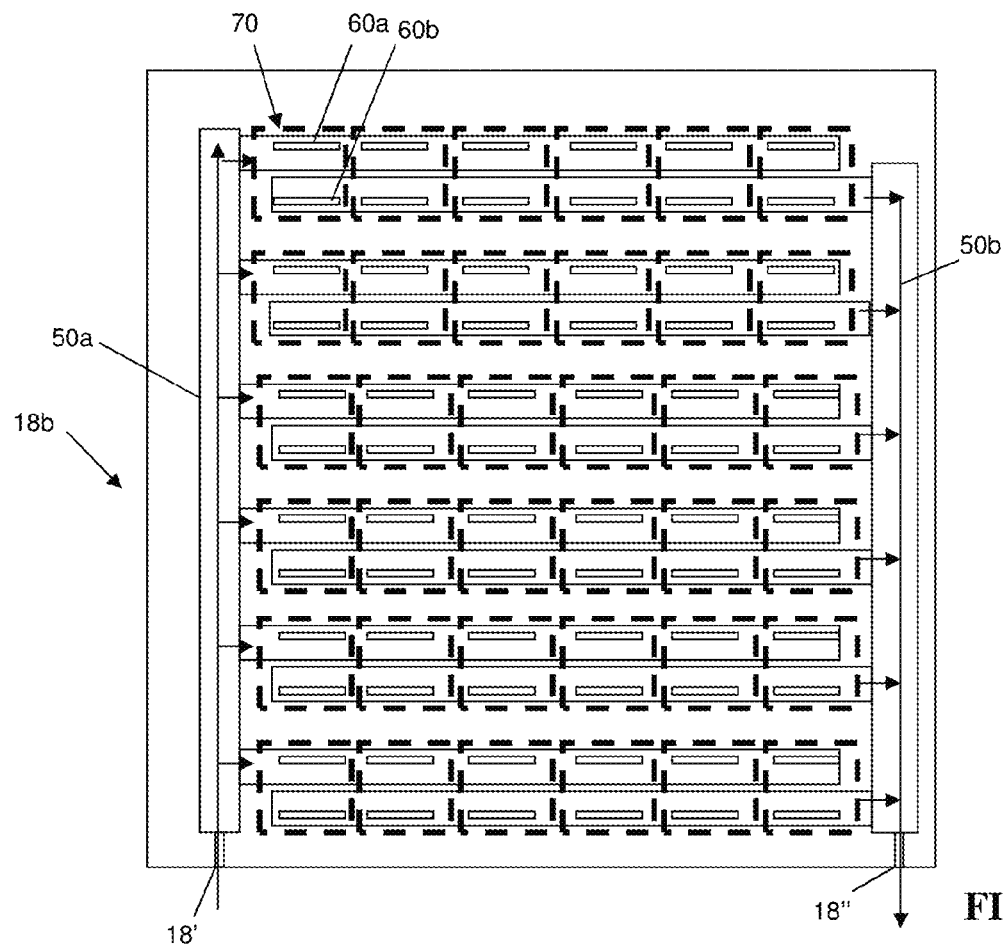
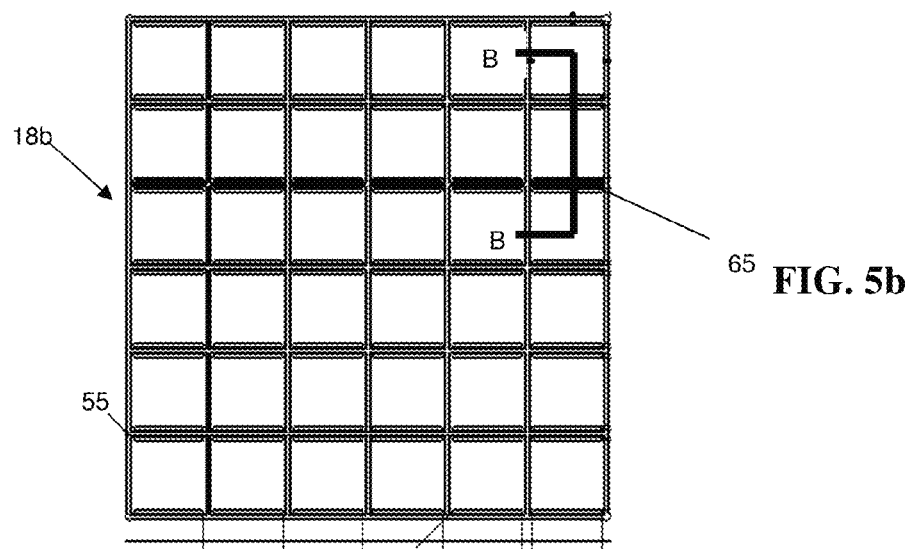
FIG. 5a
FIG. 5b

COOLING STRUCTURE FOR ELECTRONIC BOARDS

FIELD OF THE INVENTION

The invention relates to cooling structures and, more particularly, to a cooling structure for large electronic boards with closely-spaced heterogeneous die and packages.

BACKGROUND

It is important in electronic circuitry and packages to adequately cool large electronic boards that include multiple chips and packages mounted to the boards. In electronic systems, a heat sink or cold plate is a passive heat exchanger used to cool the multiple chips and packages by dissipating heat into the surrounding medium. For example, heat sinks and cold plates are used with high-power semiconductor devices such as power transistors and optoelectronics such as lasers and light emitting diodes (LEDs), where the heat dissipation ability of the basic device is insufficient to moderate its temperature.

A heat sink or cold plate is designed to maximize its surface area in contact with the cooling medium surrounding it, such as the air and liquid, as well as to maximize its surface area with the chip and package. In conventional systems, heat sinks or cold plates with separate air or water supplies are mounted to each chip in order to regulate heat, e.g., dissipate heat. Each heat sink or cold plate has to be individually aligned and thereafter mounted to each chip or package by a thermal interface material (TIM) such as thermal adhesives or thermal grease to improve performance by filling air gaps between the heat sink or cold plate and the device.

However, the use of separate cold plates or heat sinks becomes very problematic as chips and packages have different sizes and heights, are placed at different distances from each other and dissipate different levels of power. These different sizes, heights, etc., leads to a non-optimized cooling design leading to lower supported power levels and the need for a multitude of cooling devices. Also, each of these separate cold plates or heat sinks requiring their own separate coolant supply complicates the manufacturing process and adds additional costs.

SUMMARY

In an aspect of the invention, an assembly comprises a frame having a plurality of openings. The assembly further comprises a cold plate mounted to the frame. The cold plate comprises at least one inlet and at least one outlet and fluid channels in communication with the at least one inlet and the at least one outlet. The assembly further comprises a heat sink mounted within each of the plurality of openings which in combination with sidewalls of the openings of the frame and the cold plate form individual compartments each of which are in fluid communication with the fluid channels.

In an aspect of the invention an assembly comprises: a frame comprising a plurality of openings; a heat sink mounted within each of the plurality of openings; and a cold plate that seals each of the plurality of openings and forms a sealed compartment in combination with sidewalls of the openings and the heat sink mounted within each of the plurality of openings, the cold plate comprising: a top plate member; a bottom plate member having a top side and a bottom side; the bottom side having a plurality of grooves which accommodate the sidewalls of the openings of the frame; at least one inlet port and at least one outlet port; and fluid channels in fluid communication with each of the sealed compartments and the at least one inlet port and the at least one outlet port.

In an aspect of the invention a manifold assembly comprises: a frame assembly having a plurality of sealed compartments each comprising a single heat sink registered to an underlying chip and/or package mounted on an electronic board; a fluid channel within the frame assembly; and an inlet and an outlet associated with each of the sealed compartments and in fluid communication with the fluid channel, the inlet and the outlet directing coolant over the single heat sink of each of the sealed compartments.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 5a shows a top view of a bottom plate member of the cold plate assembly in accordance with aspects of the invention.

FIG. 5b shows a bottom view of a bottom plate member of the cold plate assembly in accordance with aspects of the present invention.

DETAILED DESCRIPTION

The invention relates to cooling structures and, more particularly, to a cooling structure for large electronic boards with closely-spaced heterogeneous die and packages. The cooling structure addresses the problem of cooling large electronic boards with multiple chips and packages mounted to the boards of various heights and mounting positions.

More specifically, the cooling structure is designed and structured to dissipate heat from chips and packages having different sizes, heights, and tilt angles, as well as placed at different distances from each other and which dissipate different levels of power. The cooling structure also provides a cooling solution for an electronic board with multiple chips and packages that are spaced extremely close to each other to enable small wire lengths and high function bandwidths. Advantageously, the cooling structure can use a single coolant supply, e.g., water or air supply, to optimize the cooling design leading to higher supported power levels and the elimination of multiple cooling devices. Thus, the cooling structure allows for increasing of power levels in the chips and the reduction in the number of individual cooling devices needed to dissipate heat from the chips and/or packages on the circuit board.

In more specific embodiments, the cooling solution comprises individual heat sinks mounted to a common frame. The individual heat sinks can be aligned over each chip or package with a TIM of minimum bondline with a single alignment process. This is achieved by incorporating the heat sinks in the common frame. A single cold plate (e.g., manifold) is mounted to the frame and acts as a single source manifold for supplying coolant to the heat sinks. The heat sinks are soldered or epoxied into the common frame over each chip or package application. The minimum TIM bondline is obtained by reflowing the solder or letting the epoxy cure in place to allow the heat sink to register over each chip or package.

Figure 1:
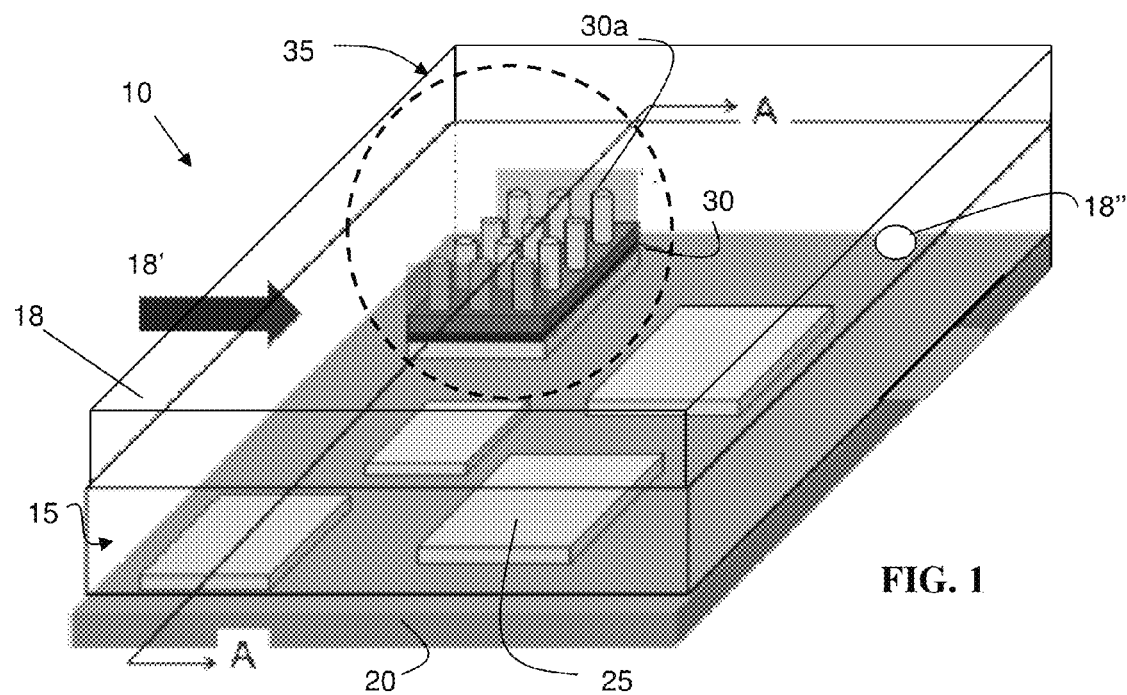
FIG. 1 shows a highly schematic representation of a cooling structure in accordance with aspects of the invention.

FIG. 1 shows a highly schematic illustration of the cooling structure in accordance with aspects of the present invention. In embodiments, the cooling structure 10 includes a frame 15 and a cold plate 18 attached to the frame 15. The cold plate 18 can be a hollow frame or can include cavities for directing the flow of coolant, e.g., water, to individual heat sinks 30 mounted to the frame 15. In embodiments, the frame 15 and cold plate 18 are composed of structural material such as stainless steel or aluminum, amongst other contemplated materials.

The cold plate 18 includes an inlet 18' and an outlet 18" for the flow of coolant through the cold plate 18 (e.g., manifold) and over the heat sinks 30 mounted to the frame 15. The inlet 18' and the outlet 18" can be placed at various locations around the cold plate 18 as described further herein. The coolant can be water or air supply or other known coolant, which will flow over the heat sinks 30 as further described below.

In embodiments, the frame 15 is mounted to a circuit board 20 having a variety of chips and or packages of different sizes, shapes, heights, etc., as represented by reference numeral 25. The circuit board 20 can be any conventional circuit board such as, e.g., a glass board with an array of chips and packages 25 closely spaced apart. A plurality of heat sinks 30 are soldered or epoxied within openings provided within the frame 15, which also serves to allow coolant to be supplied to each of the heat sinks 30 in separate compartments as provided from the cold plate 18. The heat sinks 30 can be any heatsink material such as copper or aluminum; although other materials are also contemplated by the present invention. The heat sinks 30 can include fins 30a of various dimensions. In embodiments, the heat sinks 30 are soldered or epoxied to the frame 15, directly aligned with each of the electronic chips or package 25 as shown representatively within the dashed circle at reference numeral 35.

As should be understood by those of skill in the art, a single heat sink 30 can be mounted to multiple chips and/or packages which are placed very closely together. It should be further understood that each of the heat sinks 30, as described herein, can be adjusted to a specific height and tilt angle of each of the multiple chips and/or packages 25 mounted on the circuit board 20, within the frame 15. Also, each of the heat sinks 30 can be aligned to each of the chips and/or packages in a single alignment process using the frame 15. The heat sinks 30 are also designed to have a same dimension, e.g., width and length, of each of the multiple chips and/or packages 25 mounted on the circuit board 20 to ensure optimized contact and hence optimized heat dissipation.

Figure 2:
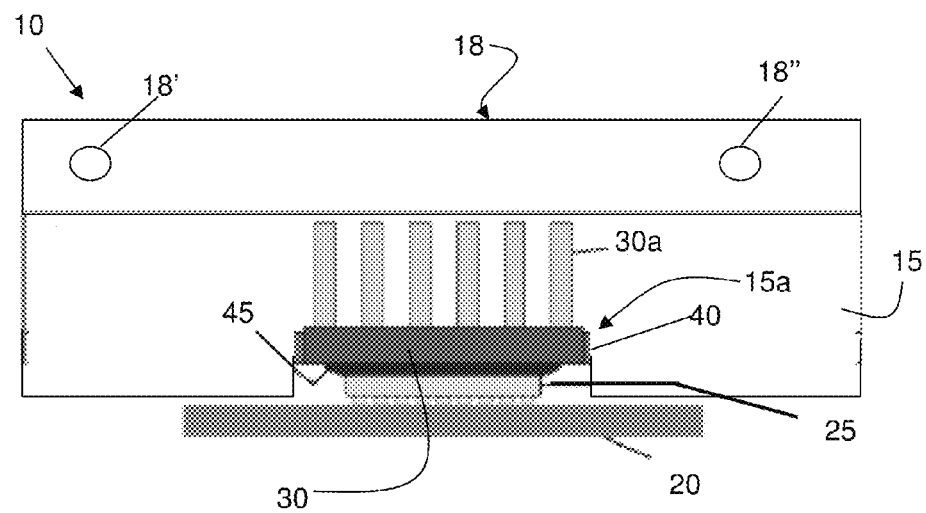
FIG. 2 shows a cross-sectional view of the cooling structure of FIG. 1, along lines A-A.

FIG. 2 shows a highly schematic cross-sectional view of the cooling structure 10 of FIG. 1, along lines A-A. As shown in this cross sectional view, the frame 15 includes a plurality of openings 15a. As described further herein, each of the heat sinks 30 is mounted into the individual openings 15a by solder or epoxy 40. The cold plate 18 is mounted to the frame 15 and supplies coolant to each heat sink 30 within each individual opening 15a. In this way, a single frame assembly can be used as a manifold to supply coolant to a multitude of different heat sinks 30.

The cold plate 18 will be sealed to the frame 15 by epoxy or solder, such that each heat sink 30 will be provided in a separate, sealed compartment which can accommodate the flow of coolant over each of the heat sinks 30. The coolant can flow through the cold plate 18 through the inlets 18' and outlets 18", and directed into each of the sealed compartments through a network of channels and openings, as further described herein. In this way, a single coolant supply can be used to efficiently dissipate heat from a plurality of chips and packages 25.

As further shown in FIG. 2, the heat sink 30 includes a plurality of fins 30a. The fins 30a can be of a variety of different shapes such as, e.g., cuboidal or cylindrical pin fins or channels that may be parallel or trapezoidal, etc. The heat sink 30 is bonded to the chip and/or package 25 by a thermal interface material (TIM) 45. The TIM 45 has a minimum TIM bondline obtained by loading the heat sinks 30 against the chips or packages 25. By way of example, the minimum TIM bondline is obtained by reflowing the solder or letting the epoxy cure in place to allow the heat sink 30 to register over each chip or package 25. In embodiments, the TIM 45 can be thermal greases, gels, compounds, adhesives, pastes or metal interfaces, for example.

Figure 3:
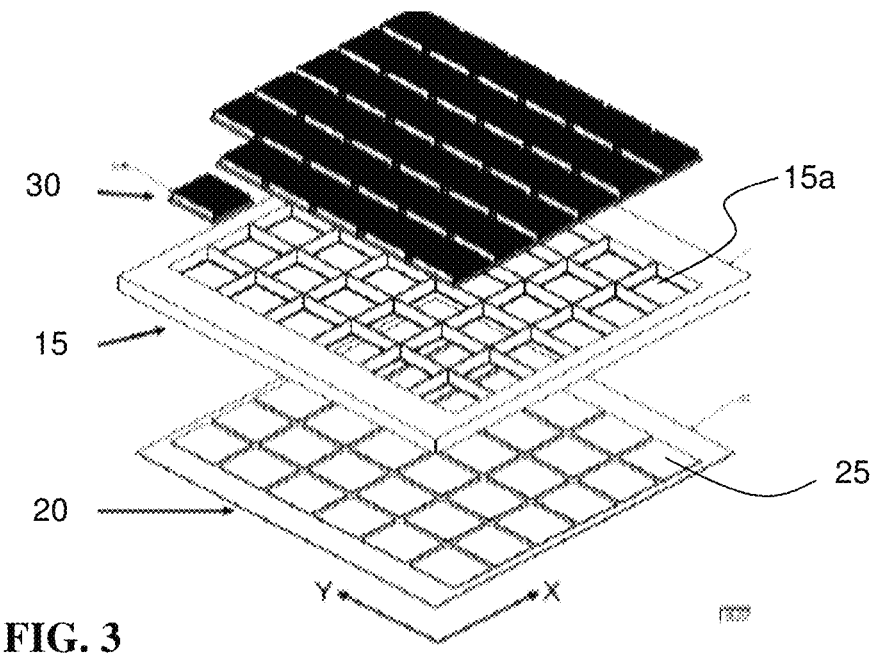
FIG. 3 is an exploded view of the cooling structure in accordance with aspects of the invention.

FIG. 3 is an exploded view of a portion of the cooling structure in accordance with aspects of the present invention. As shown in this representation, the frame 15 includes a plurality of openings 15a, which are sized to accommodate separate heat sinks 30. The openings 15a can include a stepped portion (ledge) for mounting of the heat sinks 30, as described further herein. The openings 15a and hence the heat sinks 30 are sized to each of the different chips and/or packages 25 mounted on the board 20. In this way, a single frame 15 can be used to (i) align and mount plural heat sinks 30 to plural chips and packages and (ii) provide a single coolant assembly for plural heat sinks 30.

Figure 4:
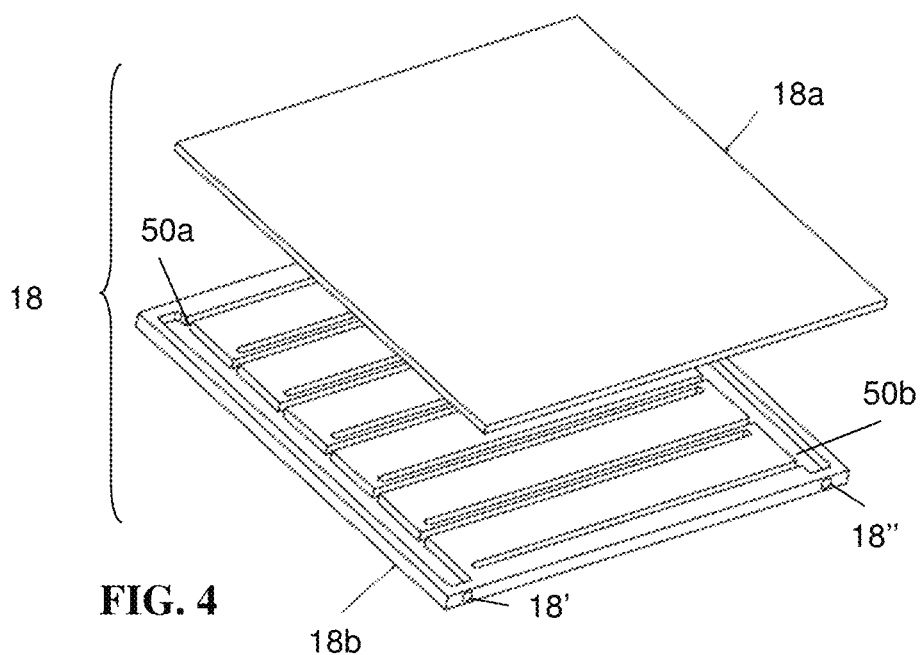
FIG. 4 shows an exploded view of a cold plate assembly of the cooling structure in accordance with aspects of the invention.

FIG. 4 shows an exploded view of the cold plate 18 in accordance with aspects of the invention. The cold plate 18 includes a top plate member 18a and bottom plate member 18b which are sealed together to form the cold plate 18. The bottom plate member 18b includes a plurality of inlet and outlet fluid channels or cavities 50a, 50b connected respectively to the inlets 18' and outlets 18" for the flow of coolant. The top plate member 18a is sealed to the bottom plate member 18b to ensure that the coolant remains within the fluid channels 50a, 50b, which is directed to each of the individual openings (e.g., heat sinks 30) by way of slots or openings as described herein.

FIG. 5a shows a top view of the bottom plate member 18a of the cold plate 18; whereas, FIG. 5b shows a bottom view of the bottom plate member 18a of the cold plate 18. As shown in these views, the top of the bottom plate member 18a includes a plurality of inlet channels 50a and a plurality of outlet channels 50b, connected to the inlet 18' and outlet 18", respectively. Each of these channels 50a, 50b include inlet openings (ports) 60a and outlet openings (ports) 60b, associated with a separate compartment 70.

As should be understood, the separate compartments 70 will be formed by the sidewalls of the openings 15a, the underside surface of the bottom plate member 18b and the heat sink 30, itself. The compartment 70 will be watertight due to the combination of the solder or epoxy connection of the heat sink 30 to the sidewalls of the opening 15a, as well as the connection of the bottom plate member 18b to the cold plate 18. Coolant will be directed through each of these compartments 70 (and hence in contact with the heat sinks) as shown representatively by the arrows passing from the (i) inlet 18', (ii) inlet channels 50a, (iii) inlet openings (ports) 60a to the compartment 70, (iii) outlet openings (ports) 60b from the compartment 70 and (iv) outlet channels 50b.

FIG. 5b shows the underside surface of the bottom plate member 18b. The underside surface includes a plurality of recesses or grooves 55. These grooves 55 correspond to the sidewalls of the openings of the frame 15, e.g., openings 15a of the frame 15. In embodiments, the sidewalls of the openings 15a will be soldered or epoxied within the grooves 55 to ensure that each of the heat sinks 30 will be provided in a separate, sealed compartment 70. In embodiments, the grooves 55 can accommodate a seal ring, e.g., O-ring seal, epoxy or solder, as shown representatively at reference numeral 65.

Figure 6:
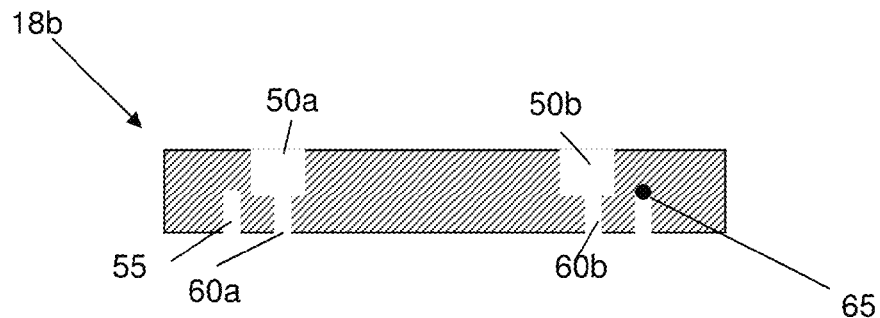
FIG. 6 shows a cross-sectional view of the bottom plate member of FIG. 5b, along line B-B.

FIG. 6 shows a cross-sectional view of the bottom plate member 18b along line B-B of FIG. 5b. As shown in this view, each of the fluid channels 50a, 50b will include inlet openings 60a and outlet openings 60b so that coolant can flow through each separate compartment, e.g., holding separate heat sinks. That is, the fluid channels 50a, 50b will be in fluid communication with the respective inlet openings 60a and outlet openings 60b for each compartment 70 (as shown in FIG. 5a), which allows the coolant, e.g., water or air supply, to flow into the individual compartments, e.g., over the heat sinks 30 within the compartments. The inlet openings 60a and outlet openings 60b will be provided within the confines of the grooves 55. In this way, a single frame assembly, e.g., frame 15 for holding the heat sinks and cold plate 18 for supply coolant to the individual heat sinks, can be used as a manifold to provide a single coolant supply to a multitude of heat sinks to dissipate heat from multiple chips and packages having different sizes and heights, placed at different distances from each other. Accordingly, the frame assembly described herein optimizes the cooling design leading to higher supported power levels and the elimination of multitude of cooling devices.

Figure 7:
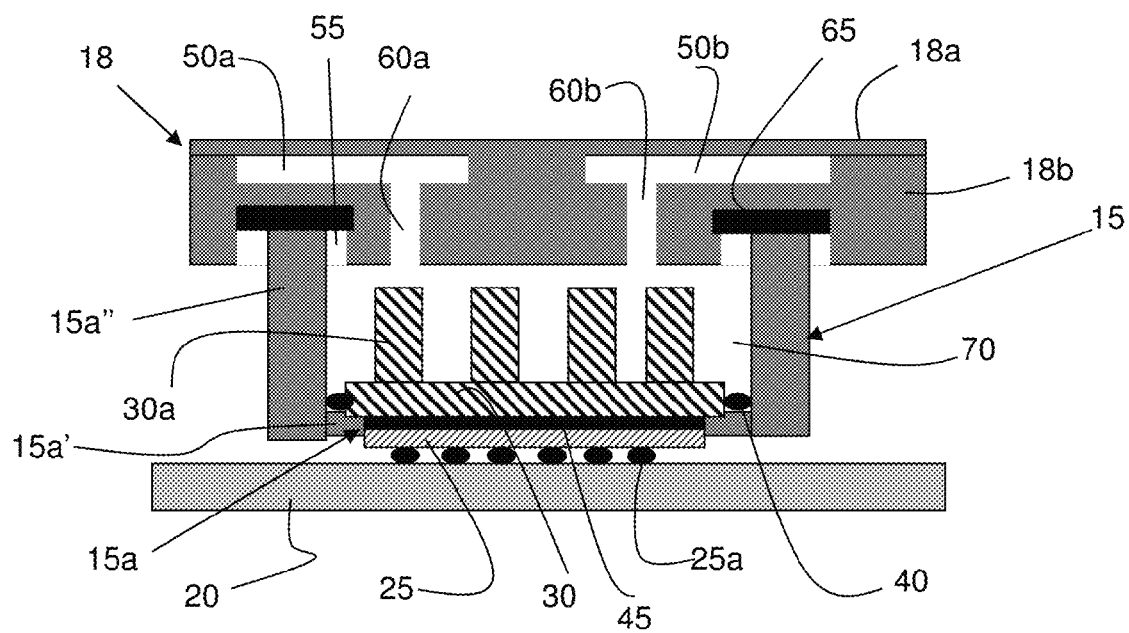
FIG. 7 shows a partial cross sectional view of a cold plate assembly attached to a chip/package in accordance with aspects of the invention.

FIG. 7 shows a partial cross-sectional view of frame assembly and related components, attached to a chip/package in accordance with aspects of the invention. More specifically, as shown in FIG. 7, the heat sink 30 (with fins 30a) is provided within an opening 15a of the frame 15. In embodiments, the heat sink 30 can be mounted to a ledge 15a' of the opening 15a by an epoxy or solder, as represented by reference numeral 40. As noted already herein, the minimum TIM bondline 45 can be obtained by reflowing the solder or letting the epoxy cure in place to allow the heat sink 30 to register over each chip or package 25. The chip or package 25 is shown to be mounted to the circuit board 20 by solder connections 25a.

As further shown in FIG. 7, the heat sink 30 is provided within a sealed compartment 70 formed partly by the cold plate 18. The sealed compartment 70 can be watertight, as defined by the sidewalls of the opening 15a of the frame 15 and the underside surface of the cold plate 18, e.g., bottom plate member 18b of the cold plate 18, and the heat sink 30 sealed to the sidewalls. The bottom plate member 18b is mounted to the sidewalls of the opening 15a by mounting of the sidewalls 15a" within the grooves 55. In embodiments, the sidewalls of the openings 15a will be soldered or epoxied to the grooves 55 as shown at reference numeral 65. An O-ring can also be placed within the groove 55. In either of these different embodiments, the compartment will be watertight.

The bottom plate member 18b is sealed to the top plate member 18a thereby forming fluid channels 50a, 50b, which are in fluid connection with the inlets 60a and outlets 60b to each separate compartment 70. The combination of the fluid channels 50a, 50b with the inlets 60a and outlets 60b will direct coolant through each of the individual sealed compartments 70. In this way, the frame assembly described herein acts as a manifold for directing fluid to each individual compartment and over each of the individual heat sinks 30.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An assembly, comprising:
   a frame having a plurality of openings;
   a cold plate mounted to the frame, the cold plate comprising at least one inlet and at least one outlet and fluid channels in communication with the at least one inlet and the at least one outlet; and
   a heat sink mounted within each of the plurality of openings which in combination with sidewalls of the openings of the frame and the cold plate form individual compartments each of which are in fluid communication with the fluid channels, wherein:
   the fluid channels comprise an input fluid channel and an output fluid channel;
   the input fluid channel is in fluid communication with each individual compartment through an input port communicating to each of the individual compartments;
   the output fluid channel is in fluid communication with each individual compartment through an output port communicating to each of the individual compartments; and the cold plate includes grooves which are structured to accommodate sidewalls of the plurality of openings of the frame for mounting of the frame to the cold plate.

2. The assembly of claim 1, wherein each individual compartment is a sealed compartment.

3. The assembly of claim 1, further comprising an o-ring within the grooves.

4. The assembly of claim 1, further comprising epoxy or solder within the grooves to mount the cold plate to the frame.

5. The assembly of claim 1, wherein the cold plate comprises a top plate member and a bottom plate member, the bottom plate member comprises the grooves and the top plate member forms a surface of the fluid channels.

6. The assembly of claim 1, wherein each of the heat sinks includes fins.

7. The assembly of claim 6, wherein the fins are one of cuboidal, cylindrical pin fins, channels that are parallel and trapezoidal.

8. The assembly of claim 1, wherein the heat sink in each of the plurality of openings is epoxied or soldered to sidewalls of the openings.

9. The assembly of claim 1, wherein the heat sink in each of the plurality of openings is registered and spans over at least one underlying chip or package mounted on an electronic board and mounted thereon by a thermal interface material (TIM).

10. An assembly, comprising:
a frame comprising a plurality of openings;
a heat sink mounted within each of the plurality of openings; and
a cold plate that seals each of the plurality of openings and forms a sealed compartment in combination with sidewalls of the openings and the heat sink mounted within each of the plurality of openings, the cold plate comprising:
a top plate member;
a bottom plate member having a top side and a bottom side;
the bottom side having a plurality of grooves which accommodate the sidewalls of the openings of the frame;
at least one inlet port and at least one outlet port; and
fluid channels in fluid communication with each of the sealed compartments and the at least one inlet port and the at least one outlet port.

11. The assembly of claim 10, wherein each of the heat sinks includes fins.

12. The assembly of claim 11, wherein the fins are one of cuboidal, cylindrical pin fins, channels that are parallel and trapezoidal.

13. The assembly of claim 10, wherein the heat sink in each of the plurality of openings is epoxied or soldered to the sidewalls of the openings.

14. The assembly of claim 10, further comprising an inlet and an outlet in fluid communication with the fluid channels and corresponding to each of the sealed compartments.

15. The assembly of claim 10, wherein the heat sink in each of the plurality of openings is mounted to the underlying chip or package by a thermal interface material (TIM).

16. The assembly of claim 10, wherein a heat sink spans multiple chips and/or packages mounted on an electronic board.

\* \* \* \* \*